US012665530B2

(12) United States Patent
Chen

(10) Patent No.: US 12,665,530 B2
(45) Date of Patent: Jun. 23, 2026

(54) MOTOR CONTROLLER WITH DATA BIT EXPANSION MECHANISM

(71) Applicant: ANPEC ELECTRONICS CORPORATION, Hsinchu (TW)

(72) Inventor: Li-Wei Chen, Hsinchu City (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 289 days.

(21) Appl. No.: 18/656,555

(22) Filed: May 6, 2024

(65) Prior Publication Data

US 2025/0274062 A1     Aug. 28, 2025

(30) Foreign Application Priority Data

Feb. 22, 2024     (TW) ................................. 113106266

(51) Int. Cl.
| | |
|---|---|
| *H02P 6/08* | (2016.01) |
| *H02P 6/06* | (2006.01) |
| *H03M 1/12* | (2006.01) |
| *H03M 5/14* | (2006.01) |

(52) U.S. Cl.
CPC .............. *H02P 6/06* (2013.01); *H03M 1/126* (2013.01); *H03M 5/14* (2013.01)

(58) Field of Classification Search
CPC ........... H02P 6/06; H03M 5/14; H03M 1/126
USPC ...................................................... 318/400.4
See application file for complete search history.

(56) References Cited

U.S. PATENT DOCUMENTS

| | | | | |
|---|---|---|---|---|
| 5,825,151 A * | 10/1998 | Ikawa | ........................ | H02P 8/14 318/685 |
| 11,664,752 B2 * | 5/2023 | Kobayashi | ................ | H02P 8/02 318/696 |
| 11,742,787 B1 * | 8/2023 | Tsai | ..................... | H02M 7/5395 318/798 |
| 2011/0234129 A1 * | 9/2011 | Shimizu | .................... | H02P 6/12 318/400.04 |
| 2012/0293097 A1 * | 11/2012 | Tachibana | ................. | H02P 6/06 318/400.06 |
| 2019/0123666 A1 * | 4/2019 | Mizuo | ...................... | H02P 6/153 |
| 2020/0028458 A1 * | 1/2020 | Harada | ................. | B41J 19/202 |
| 2021/0404478 A1 * | 12/2021 | Nishi | .................... | F04D 29/325 |

* cited by examiner

*Primary Examiner* — Gabriel Agared
(74) *Attorney, Agent, or Firm* — Li & Cai Intellectual Property Office

(57)     ABSTRACT
A motor controller with a data bit expansion mechanism is provided. The motor controller sets a plurality of pieces of target waveform characteristic data that are used respectively within a plurality of magnetic pole position time intervals to output a motor control output instruction. The motor controller, according to each of the plurality of pieces of target waveform characteristic data, generates a plurality of pieces of sub-target waveform characteristic data in a bit number expansion instruction. The plurality of pieces of sub-target waveform characteristic data are used respectively within a plurality of bit expansion time intervals. The bit number of each of the plurality of pieces of sub-target waveform characteristic data is smaller than an upper limit bit number. The motor controller generates a plurality of bit-expansion waveforms according to the bit number expansion instruction for controlling a motor.

19 Claims, 9 Drawing Sheets

MOTOR CONTROLLER WITH DATA BIT EXPANSION MECHANISM

CROSS-REFERENCE TO RELATED PATENT APPLICATION

This application claims the benefit of priority to Taiwan Patent Application No. 113106266, filed on Feb. 22, 2024. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to motor controllers and more particularly to a motor controller with a data bit expansion mechanism.

BACKGROUND OF THE DISCLOSURE

Conventional motor controllers often modulate the pulse width modulation signal output to the motor to adjust the rotational speed of the motor. If a more precise speed needs to be controlled by the conventional motor controller, a higher bit number is usually used for control. However, a higher bit number also means that a higher frequency oscillator and more logic circuits are needed for implementation, so as to decode a set of digital control signals to control the rotational speed of the motor.

In order to increase the bit number of the output pulse width modulation signal, the conventional motor controller substitutes the parameters used for improvement during the triangular wave cycle of output switching. However, this action may change the frequency of the pulse width modulation signal, or destroy the sinusoidal continuity of the output pulse width modulation signal, causing discontinuity in the motor output current.

SUMMARY OF THE DISCLOSURE

In response to the above-referenced technical inadequacies, the present disclosure provides a motor controller with a data bit expansion mechanism. The motor controller with a data bit expansion mechanism provided by the present disclosure includes an output instruction generation circuit, a bit number expansion circuit and a motor control circuit. The output instruction generation circuit is configured to set a plurality of target waveform characteristic data respectively for a plurality of magnetic pole position time intervals to output a motor control output instruction, in which the target waveform characteristic data of each magnetic pole position time interval has a target bit number. The bit number expansion circuit is connected to the output instruction generation circuit and configured to generate a plurality of sub-target waveform characteristic data in a bit number expansion instruction according to each target waveform characteristic data whose target bit number is greater than an upper limit bit number, and a plurality of the sub-target waveform characteristic data of each target waveform characteristic data, in which the bit number of each sub-target waveform characteristic data is less than the upper limit bit number. The motor control circuit is connected to the bit number expansion circuit and a motor and configured to generate a plurality of waveforms respectively having the plurality of sub-target waveform characteristic data as a plurality of bit number expansion waveforms according to the bit number expansion instruction received from the bit number expansion circuit, and controls the motor in a plurality of bit expansion time intervals divided from a bit number expansion time interval according to the plurality of bit number expansion waveforms.

As mentioned above, the present disclosure provides a motor controller with a data bit expansion mechanism. When the bit number of the motor control output instruction used to control the state of the motor to change to the target state exceeds the bit number that the motor control circuit can process, the motor controller of the present disclosure performs a bit number expansion operation on the motor control output instruction to reduce the resolution of the motor control output instruction by breaking it up. As a result, the present disclosure uses a motor controller with lower resolution, computing power, etc., but can still achieve high-resolution motor control and smoothly control the state of the motor to gradually change to the target state. For example, the rotational speed of the motor gradually increases until it reaches the target rotational speed, thereby saving circuit costs. Furthermore, the motor controller of the present disclosure can maintain stable operation of the motor while providing high resolution.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
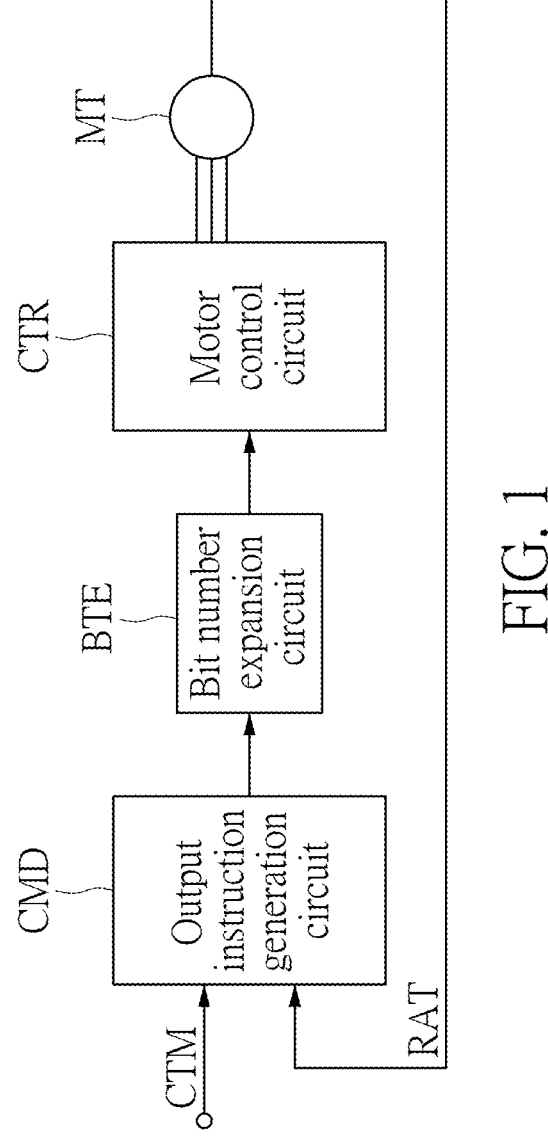
FIG. 1 is a block diagram of a motor controller with a data bit expansion mechanism according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether or not a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

Figure 2:
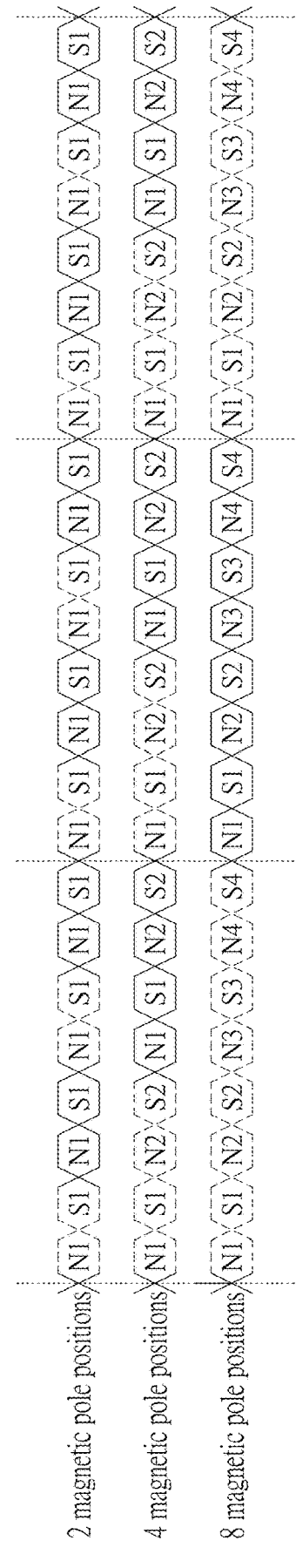
FIG. 2 is a schematic diagram of a plurality of magnetic pole positions of a rotor of the motor controlled by the motor controller with the data bit expansion mechanism according to the first embodiment of the present disclosure.

Reference is made to FIGS. 1 and 2. FIG. 1 is a block diagram of a motor controller with a data bit expansion mechanism according to a first embodiment of the present disclosure, and FIG. 2 is a schematic diagram of a plurality of magnetic pole positions of the rotor of the motor controlled by the motor controller with the data bit expansion mechanism according to the first embodiment of the present disclosure.

As shown in FIG. 1, in the first embodiment, the motor controller with a data bit expansion mechanism of the present disclosure includes an output instruction generation circuit CMD, a bit number expansion circuit BTE and a motor control circuit CTR. The bit number expansion circuit BTE is connected to the output instruction generation circuit CMD and the motor control circuit CTR. The motor control circuit CTR is connected to the motor MT.

The motor controller of the present disclosure is used to control the operation of the motor MT, so that the rotor of the motor MT switches to a plurality of magnetic pole (or slot pole) positions respectively within a plurality of magnetic pole position time intervals.

Generally speaking, the rotor of the motor MT will be equipped with 2N magnetic pole positions for phase switching, where N is a positive integer greater than or equal to 1. For example, as shown in FIG. 2, the rotor of the motor MT is configured with two (N=1) magnetic pole positions N1 and S1 for phase switching, or the rotor of the motor MT is configured with four (N=2) magnetic pole positions N1, S1, N2, S2 for phase switching, or the rotor of the motor MT is configured with eight (N=4) magnetic pole positions N1, S1, N2, S2, N3, S3, N4, S4 for phase switching. The above description is only an example, and the present disclosure is not limited thereto.

The output instruction generation circuit CMD sets the target waveform characteristic data in each magnetic pole position time interval in the plurality of magnetic pole position time intervals to output the motor control output instruction. The output instruction generation circuit CMD defines the bit number of the target waveform characteristic data of each magnetic pole position time interval in the plurality of magnetic pole position time intervals as a target bit number.

If necessary, the output instruction generation circuit CMD can be connected to the external input instruction issuing circuit to set the target waveform characteristic data in each magnetic pole position time interval of the plurality of magnetic pole position time intervals according to a motor control input instruction received from the external input instruction issuing circuit to output motor control output instruction.

In order to more accurately control the changes in the operating status of the motor MT, the output instruction generation circuit CMD can also be connected to the motor MT to detect the operating status data RAT of the motor MT (such as, but not limited to, the rotational speed of the motor MT) to determine which one of a plurality of magnetic pole positions a rotor of the motor MT switches to within each magnetic pole position time interval to generate a motor detection signal. Then, the output instruction generation circuit CMD can set the target waveform characteristic data for each magnetic pole position time interval in the plurality of magnetic pole position time intervals according to the motor detection signal and the motor control input instruction to output the motor control output instruction.

It is worth noting that the computing power and other performance of the motor control circuit will affect the bit number of data that the motor control circuit can process in each time interval. In the following paragraphs, the maximum bit number of data that the motor control circuit CTR can process in each time interval is defined as an upper limit bit number. It should be understood that motor control circuits with different performance may have different upper limit bit numbers.

The output instruction generation circuit CMD sets the time for each magnetic pole position in the plurality of magnetic pole position time intervals according to the target rotational speed of the motor MT (indicated by a motor control input instruction received from the external input instruction issuing circuit) to output a motor control output instruction, so that the motor MT can control the rotational speed of the motor MT to the target rotational speed in the shortest time. The motor control output instruction indicates that the bit number of data processed within each magnetic pole position time interval, that is, the target bit number described herein, may exceed an upper limit bit number of the motor control circuit CTR.

Therefore, the motor controller of the present disclosure further includes a bit number expansion circuit BTE for performing data bit expansion operations.

The number expansion circuit BTE determines whether a target bit number of each target waveform characteristic data in the plurality of magnetic pole position time intervals indicated by the motor control output instruction received from the output instruction generation circuit CMD exceeds an upper limit bit number of the motor control circuit CTR.

The bit number expansion circuit BTE executes a data bit for each target waveform characteristic data in the plurality of magnetic pole position time intervals indicated by the motor control output instruction received from the output instruction generation circuit CMD having a target bit number greater than an upper limit bit number of the motor control circuit CTR to perform a data bit expansion operation. A more detailed description is provided as follows.

The bit number expansion circuit BTE generates a plurality of sub-target waveforms characteristic data in the bit number expansion instruction according to each target waveform characteristic data whose target bit number in the motor control output instruction is greater than an upper limit bit number of the motor control circuit CTR. Each sub-target waveform characteristic data is a part of data extracted from a target waveform characteristic data.

The bit number expansion circuit BTE indicates the plurality of sub-target waveform characteristic data of each target waveform characteristic data whose target bit number is greater than an upper limit bit number of the motor control circuit CTR, which are respectively used in the plurality of bit expansion time intervals divided from the bit number expansion time interval.

The bit number of each sub-target waveform characteristic data generated by the bit number expansion circuit BTE is less than a target bit number of a target waveform characteristic data indicated by the output instruction generation circuit CMD, and in particular, is less than the upper limit bit number of the motor control circuit CTR; that is, it does not exceed the bit number that the motor control circuit CTR can process in each bit expansion time interval.

The motor control circuit CTR generates a plurality of waveforms respectively having a plurality of sub-target waveform characteristic data to be used as a plurality of bit number expansion waveforms according to a bit number expansion instruction generated by the bit number expansion circuit BTE according to all target waveform characteristic data whose target bit number is greater than the upper limit bit number, and used in the plurality of bit expansion time intervals divided by the one bit expansion time interval.

The motor control circuit CTR outputs a plurality of motor control signals to the motor MT according to a plurality of preset waveforms and a plurality of bit number expansion waveforms received from the bit number expansion circuit BTE to control the operation of the motor MT.

For example, the above-mentioned plurality of bit number expansion waveforms include a plurality of triangle wave waveforms, a plurality of sawtooth waveforms, or any combination thereof, and the plurality of preset waveforms include a plurality of sine wave waveforms, a plurality of third harmonic waveforms, or any combination thereof, and the motor control signal includes a plurality of pulse waves. The above are only examples, and the present disclosure is not limited thereto.

The motor control circuit CTR can compare the voltage levels of plurality of bit number expansion waveforms with the voltage levels of plurality of preset waveforms to determine the voltage levels of plurality of motor control signals output to the motor MT.

It is worth noting that the bit number of a sub-target waveform characteristic data used to control the motor MT in each bit expansion time interval is less than an upper limit bit number of the motor control circuit CTR. The upper limit bit number depends on the resolution and other performance of the motor control circuit CTR. Therefore, in each bit expansion time interval, the motor control circuit CTR can generate a normal bit number expansion waveform according to a sub-target waveform characteristic data, and then output a motor control signal to the motor MT according to a bit number expansion waveform and a preset waveform to smoothly control the state of the motor MT to gradually change to the target state. For example, the rotational speed of the motor MT gradually increases until it reaches the target rotational speed.

Figure 3:
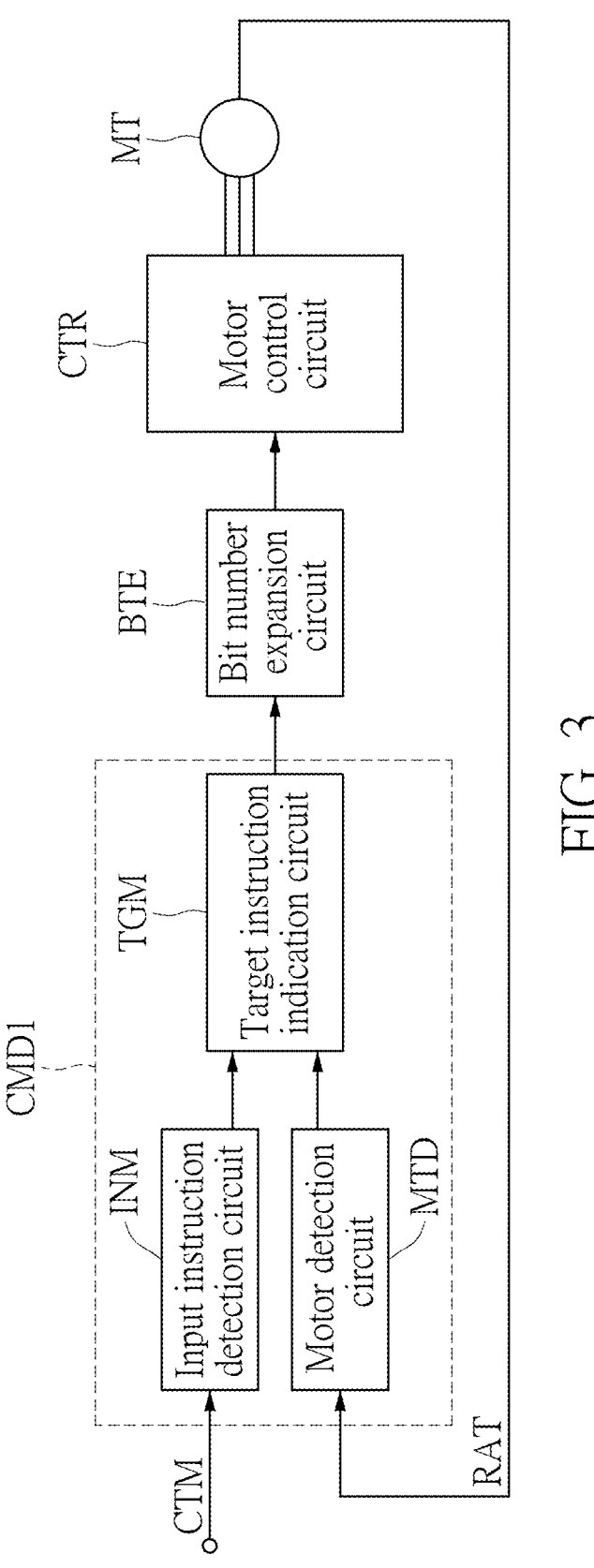
FIG. 3 is a block diagram of a motor controller with a data bit expansion mechanism according to a second embodiment of the present disclosure.

Reference is made to FIG. 3. FIG. 3 is a block diagram of a motor controller with a data bit expansion mechanism according to a second embodiment of the present disclosure.

As shown in FIG. 3, in the second embodiment, the motor controller of the present disclosure includes an output instruction generation circuit CMD1, a bit number expansion circuit BTE and a motor control circuit CTR. The output instruction generation circuit CMD1 includes an input instruction detection circuit INM, a motor detection circuit MTD and a target instruction indication circuit TGM.

In the second embodiment, the target instruction indication circuit TGM may be an open-loop circuit, but the present disclosure is not limited thereto.

The target instruction indication circuit TGM is connected to the input instruction detection circuit INM, the motor detection circuit MTD and the bit number expansion circuit BTE. The motor control circuit CTR is connected to the bit number expansion circuit BTE and the motor MT.

The input instruction detection circuit INM detects a motor control input instruction CTM output by an external input instruction issuing circuit, and outputs an input control detection signal to the target instruction indication circuit TGM according to the target state of the motor MT (including a target rotational speed of the motor MT) indicated by the detected motor control input instruction CTM.

The motor detection circuit MTD detects the operating status data RAT of the motor MT, such as, but not limited to, the rotor position of the motor MT and the current rotational speed of the motor MT, to determine which one of the plurality of magnetic pole positions a rotor of the motor MT switched to within each of the plurality of magnetic pole position time intervals to output a motor detection signal to the target instruction indication circuit TGM.

The target instruction indication circuit TGM sets a plurality of target waveform characteristic data respectively used for the plurality of magnetic pole position time intervals according to an input control detection signal received from the input instruction detection circuit INM and a motor detection signal received from the motor detection circuit MTD to output a motor control output instruction to the bit number expansion circuit BTE, where the bit number of the target waveform characteristic data in each magnetic pole position time interval is defined as a target bit number.

The bit number expansion circuit BTE divides each target waveform characteristic data whose target bit number is greater than the upper limit bit number into a plurality of sub-target waveform characteristic data, which are used to divide a plurality of consecutive sub-target waveform characteristic data in the same bit number expansion time interval. The sum of the plurality of sub-target waveform characteristic data respectively used in the plurality of consecutive bit expansion time intervals is equal to the target waveform characteristic data.

Therefore, the motor control circuit CTR sequentially generates a plurality of waveforms having a plurality of sub-target waveform characteristic data as a plurality of bit number expansion waveforms according to the bit number expansion instruction received from the bit number expansion circuit BTE, which are respectively used to control the motor MT within a plurality of bit expansion time intervals to gradually change the state of the motor MT to the target state. For example, the rotational speed of the motor MT gradually increases until it reaches the target rotational speed.

Figure 4:
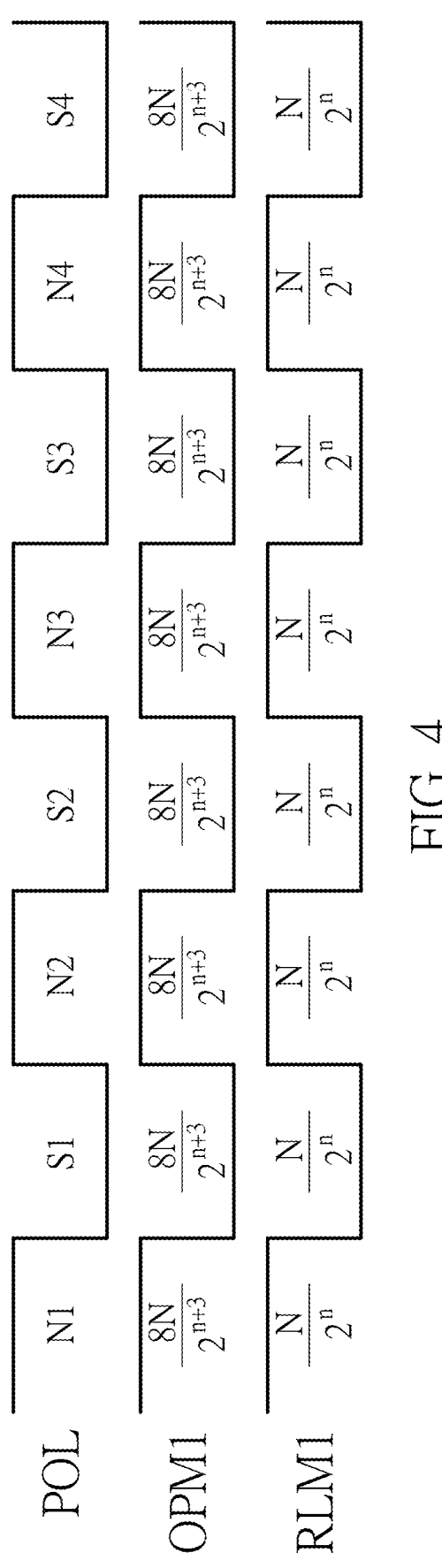
FIG. 4 is a schematic diagram of the motor detection signal, the motor control output instruction and the bit number expansion instruction of a motor controller with a data bit expansion mechanism according to a third embodiment of the present disclosure.

Reference is made to FIG. 4. FIG. 4 is a schematic diagram of the motor detection signal, the motor control output instruction and the bit number expansion instruction of a motor controller with a data bit expansion mechanism according to a third embodiment of the present disclosure.

The motor controller of the present disclosure, such as, but not limited to, the motor controller shown in FIG. 1 or FIG. 3, can generate the motor detection signal POL, the motor control output instruction OPM1 and the bit number expansion instruction RLM1 as shown in FIG. 4. A more detailed description is provided as follows.

The output instruction generation circuit CMD as shown in FIG. 1 or the output instruction generation circuit CMD1 as shown in FIG. 3 detects the operating status data of the motor MT to determine the rotor of the motor MT respectively switching to the plurality of magnetic pole positions to generate a motor detection signal POL. The motor detection circuit MTD as shown in FIG. 3 outputs the motor detection signal POL to the target instruction indication circuit TGM.

As shown in FIG. 4, the four waveforms of the motor detection signal POL are switched to 8 magnetic pole position time intervals of 8 magnetic pole positions N1, S1, N2, S2, N3, S3, N4, and S4 respectively during the working period and the non-working period.

The output instruction generation circuit CMD as shown in FIG. 1 or the target instruction indication circuit TGM of the output instruction generation circuit CMD1 as shown in FIG. 3 sets each of 8 target waveform characteristic data respectively in 8 magnetic pole position time intervals used to control the motor MT, which is represented as "8N" in FIG. 4, and the bit number "$2^{n+3}$" of each target waveform characteristic data "8N" is defined as a target bit number to output a motor control output instruction OPM1.

The target bit number "$2^{n+3}$" for each target waveform characteristic data indicated in the motor control output instruction OPM1 is greater than an upper limit bit number of the motor control circuit CTR, such as, but not limited to "2". Therefore, the bit number expansion circuit BTE divides each target waveform characteristic data "8N" in the above motor control output instruction OPM1 into 8 sub-target waveform characteristic data whose bit number is only "$2^n$"; it is represented as 8 "N" generated in the bit number expansion instruction RLM1 as shown in FIG. 4.

In each of the plurality of bit expansion time intervals (for example, the time length is equal to a magnetic pole position time interval) divided in each of the plurality of bit number expansion time intervals (for example, the time length is equal to the sum of all magnetic pole position time intervals, such as the 8 magnetic pole position time intervals shown in FIG. 4), a sub-target waveform characteristic data "N" whose bit number is only "$2^n$" is processed.

Therefore, according to the above-mentioned bit number expansion instruction RLM1, the motor control circuit CTR only needs to process the sub-target waveform characteristic data with the bit number "$2^n$" within each of the plurality of bit expansion time intervals (for example, the time length is each equal to a magnetic pole position time interval), which does not exceed the upper limit bit number of the motor control circuit CTR, such as "$2^n$", that is, it does not exceed the bit number that the motor control circuit CTR can process in each bit expansion time interval.

Therefore, in each bit expansion time interval, the motor control circuit CTR can generate a normal bit number expansion waveform according to a sub-target waveform characteristic data, and output to a motor control signal to the motor MT according to the normal bit number expansion waveform and a preset waveform to control the operation of the motor MT.

Although one sub-target waveform characteristic data in each bit expansion time interval is only a part of the target waveform characteristic data used to control the rotational speed of the motor MT to reach the target rotational speed, the motor control circuit CTR outputs a plurality of motor control signals to the motor MT according to a plurality of bit expansion waveforms respectively having a plurality of sub-target waveform characteristic data in a plurality of bit expansion time intervals to control the state of the motor MT to gradually change to the target state. For example, the rotational speed of the motor MT gradually increases until it reaches the target rotational speed.

Figure 5:
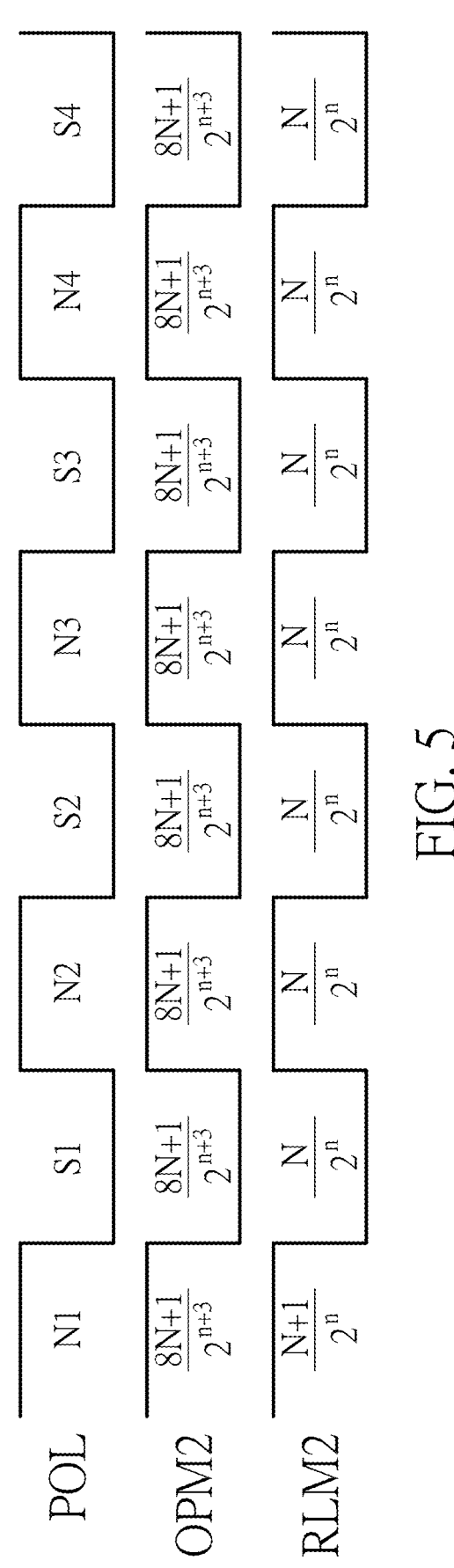
FIG. 5 is a schematic diagram of the motor detection signal, the motor control output instruction and the bit number expansion instruction of a motor controller with a data bit expansion mechanism according to a fourth embodiment of the present disclosure.

Reference is made to FIG. 5. FIG. 5 is a schematic diagram of the motor detection signal, the motor control output instruction and the bit number expansion instruction of a motor controller with a data bit expansion mechanism according to a fourth embodiment of the present disclosure.

The difference between the fourth embodiment of the present disclosure and the third embodiment of the present disclosure is that in the fourth embodiment, the target instruction indication circuit TGM of the output instruction generation circuit CMD as shown in FIG. 1 or the target instruction indication circuit TGM of the output instruction generation circuit CMD1 as shown in FIG. 3 sets each of the 8 target waveform characteristic data used to control the operation of the motor MT within the 8 magnetic pole position time intervals, as shown in FIG. 5, which is represented as "8N+1", to output a motor control output instruction OPM2.

The target bit number "$2^{n+3}$" of each target waveform characteristic data indicated in the motor control output instruction OPM2 is greater than an upper limit bit number of the motor control circuit CTR, such as, but not limited to "$2^n$". Therefore, the bit number expansion circuit BTE divides each target waveform characteristic data "8N+1" in the above motor control output instruction OPM2 into 8 sub-target waveform characteristic data with only bit number "$2^n$", as shown in FIG. 5, which are respectively represented as "N+1", "N", "N", "N", "N", "N", "N", "N" generated in the bit number expansion instruction RLM2.

The sum of 8 sub-target waveform characteristic data "N+1", "N", "N", "N", "N", "N", "N", divided from each target waveform characteristic data is the same as "8N+1" of the target waveform characteristic data.

That is to say, the bit number expansion circuit BTE performs the bit number expansion operation to divide each target waveform characteristic data "8N" with the bit number "$2^{n+3}$" processed in each of the 8 magnetic pole position time intervals respectively switched to the 8 magnetic pole positions N1, S1, N2, S2, N3, S3, N4, and S4 preset in the rotor of the motor MT into 8 sub-target waveform characteristic data with only bit number "$2^{n''}$".

Therefore, the motor control circuit CTR only needs to process the bit number "$2^{n''}$" according to the above-mentioned bit number expansion instruction RLM2 in each bit expansion time interval (for example, the time length is equal to one magnetic pole position time interval), without exceeding the upper limit bit number, such as "$2^{n''}$" of the motor control circuit CTR, that is, it does not exceed the bit number that the motor control circuit CTR can process in each bit expansion time interval.

Therefore, in each bit expansion time interval, the motor control circuit CTR can generate a normal bit number expansion waveform according to a sub-target waveform characteristic data, and output the motor control signal to the motor MT according to the normal bit number expansion waveform and a preset waveform to control the operation of the motor MT.

Although one sub-target waveform characteristic data in each bit expansion time interval is only a part of the target waveform characteristic data used to control the rotational speed of the motor MT to reach the target rotational speed, the motor control circuit CTR outputs a plurality of motor control signals to the motor MT according to a plurality of bit number expansion waveforms respectively having a plurality of sub-target waveform characteristic data and a plurality of preset waveforms in a plurality of bit expansion time intervals, which can control the state of the motor MT to gradually change to the target state. For example, the rotational speed of the motor MT gradually increases until it reaches the target rotational speed.

Figure 6:
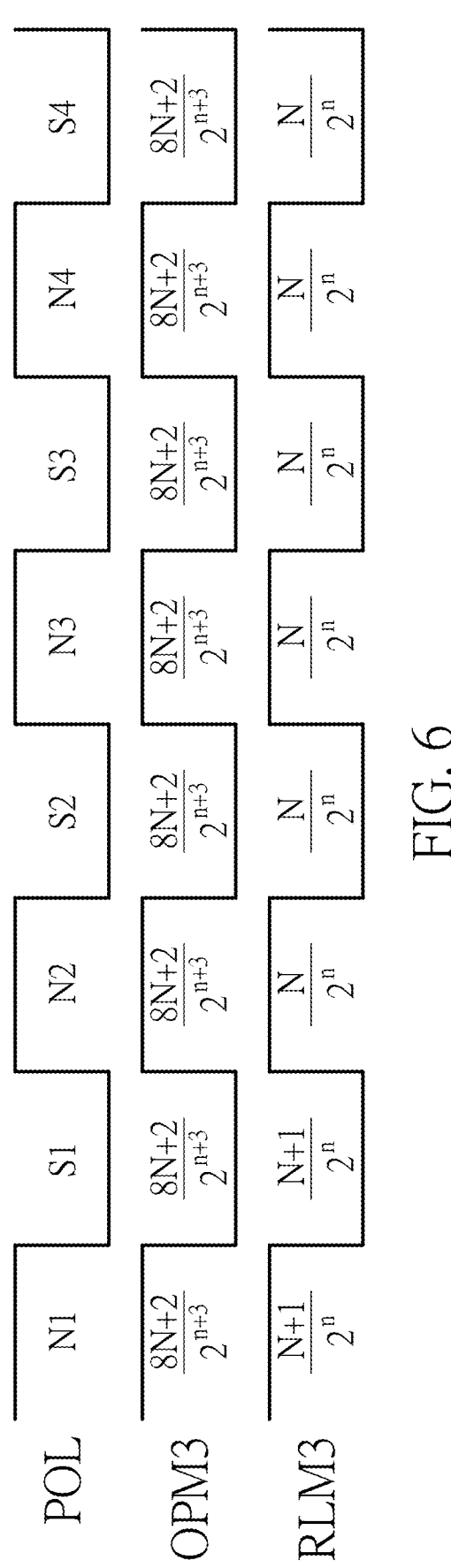
FIG. 6 is a schematic diagram of the motor detection signal, the motor control output instruction and the bit number expansion instruction of a motor controller with a data bit expansion mechanism according to a fifth embodiment of the present disclosure.

Reference is made to FIG. 6. FIG. 6 is a schematic diagram of the motor detection signal, the motor control output instruction and the bit number expansion instruction of a motor controller with a data bit expansion mechanism according to a fifth embodiment of the present disclosure.

The difference between the fifth embodiment of the present disclosure and the third embodiment of the present disclosure is that in the fifth embodiment, the target instruction indication circuit TGM of the output instruction generation circuit CMD as shown in FIG. 1 or the target instruction indication circuit TGM of the output instruction generation circuit CMD1 as shown in FIG. 3 sets each of the 8 target waveform characteristic data used to control the operation of the motor MT respectively within the 8 magnetic pole position time intervals, which is represented as "8N+2" in FIG. 6, and the bit number "$2^{n+3}$" of each target waveform characteristic data is defined as a target bit number to output a motor control output instruction OPM3.

The target bit number "$2^{n+3}$" of each target waveform characteristic data indicated in the motor control output instruction OPM3 is greater than an upper limit bit number of the motor control circuit CTR, such as, but not limited to "$2^{n''}$". Therefore, the bit number expansion circuit BTE represents each target waveform characteristic data in the above-mentioned motor control output instruction OPM3 as "8N+2" in FIG. 6, and divides it into 8 sub-target waveforms whose bit number is only "$2^{n''}$" as shown in FIG. 6, which are represented as "N+1", "N+1", "N", "N", "N", "N", "N" and "N" respectively generated in one bit number expansion instruction RLM3.

The sum of the above 8 sub-target waveform characteristic data "N+1", "N+1", "N", "N", "N", "N", "N", and "N" divided from each target waveform characteristic data is the same as the target waveform characteristic data "8N+2".

That is to say, the bit number expansion circuit BTE divides each target waveform characteristic data "8N"

whose bit number is "$2^{n+3}$" processed within the eight magnetic pole positions N1, S1, N2, S2, N3, S3, N4, and S4 respectively switched to the 8 magnetic pole position time intervals of the rotor preset in the motor MT into 8 sub-target waveform characteristic data whose bit number is "$2^{n''}$".

Therefore, the motor control circuit CTR shown in FIG. 1 or FIG. 3 only needs to process the sub-target waveform characteristic data with a bit number "$2^{n''}$" according to the above-mentioned bit number expansion instruction RLM3 in each bit expansion time interval (for example, the time length is equal to one magnetic pole position time interval), which does not exceed the upper limit bit number of the motor control circuit CTR; that is, it does not exceed the bit number that the motor control circuit CTR can process in each bit expansion time interval.

Therefore, in each bit expansion time interval, the motor control circuit CTR can generate a normal bit number expansion waveform according to a sub-target waveform characteristic data, and output to a motor control signal to the motor MT according to the normal bit number expansion waveform and a preset waveform to control the operation of the motor MT.

Furthermore, although the sub-target waveform characteristic data in each bit expansion time interval is only a part of the target waveform characteristic data used to control the rotational speed of the motor MT to reach the target rotational speed, the motor control circuit CTR outputs a plurality of motor control signals to the motor MT according to a plurality of bit expansion waveforms respectively having a plurality of sub-target waveform characteristic data and a plurality of preset waveforms in a plurality of bit expansion time intervals to control the state of the motor MT to gradually change to the target state. For example, the rotational speed of the motor MT gradually increases until it reaches the target rotational speed.

Figure 7:
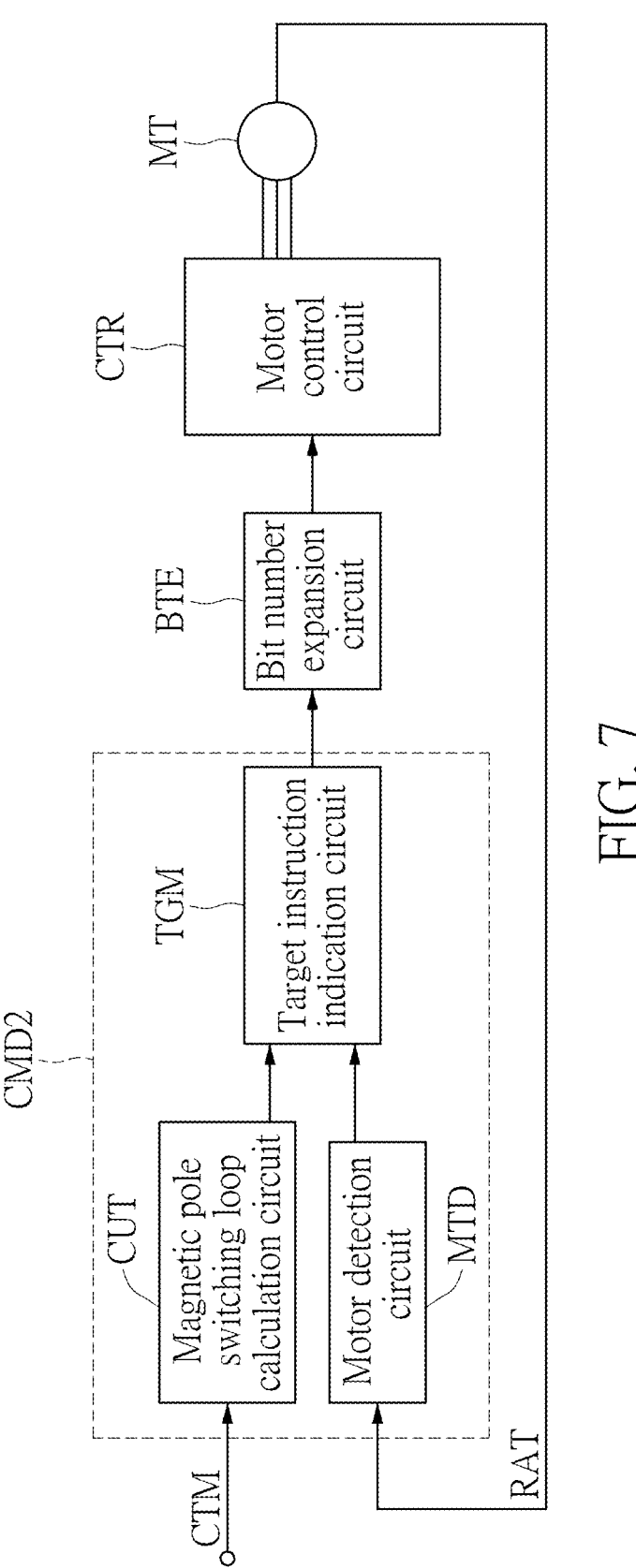
FIG. 7 is a block diagram of a motor controller with a data bit expansion mechanism according to a sixth embodiment of the present disclosure.

Reference is made to FIG. 7. FIG. 7 is a block diagram of a motor controller with a data bit expansion mechanism according to a sixth embodiment of the present disclosure.

As shown in FIG. 7, in the sixth embodiment, the motor controller of the present disclosure includes an output instruction generation circuit CMD2, a bit number expansion circuit BTE and a motor control circuit CTR. The output instruction generation circuit CMD2 includes a magnetic pole switching loop calculation circuit CUT, a motor detection circuit MTD and a target instruction indication circuit TGM.

In the sixth embodiment, the target instruction indication circuit TGM may be a closed-loop circuit, but the present disclosure is not limited thereto.

The target instruction indication circuit TGM is connected to the magnetic pole switching loop calculation circuit CUT, the motor detection circuit MTD and the bit number expansion circuit BTE. The motor control circuit CTR is connected to the bit number expansion circuit BTE and the motor MT.

The magnetic pole switching loop calculation circuit CUT defines a time interval in which the rotor of the motor MT switches to all of the plurality of magnetic pole positions sequentially as a magnetic pole switching loop, and defines a time interval of each magnetic pole of the rotor of the motor MT switched to the plurality of magnetic pole positions as a magnetic pole position time interval. That is, the magnetic pole switching loop includes a plurality of magnetic pole position time intervals.

The magnetic pole switching loop calculation circuit CUT calculates the number of the plurality of magnetic pole switching loops according to a motor control input instruction CTM obtained from an external input instruction issuing circuit, and outputs a magnetic pole switching loop calculation signal to the target instruction indication circuit TGM.

The motor detection circuit MTD detects the operating status data of the motor, such as, but not limited to, the rotor of the motor MT, the magnetic pole position of the rotor of the motor MT and other related data, so as to output a motor detection signal to the target instruction indication circuit TGM.

The target instruction indication circuit TGM sets a plurality of target waveform characteristic data respectively used to a plurality of magnetic pole positions according to a magnetic pole switching loop calculation signal received from the magnetic pole switching loop calculation circuit CUT to output a motor control output instruction to the bit number expansion circuit BTE.

The operation of the bit number expansion circuit BTE and the motor control circuit CTR is the same as above and will not be described in detail below.

Figure 8:
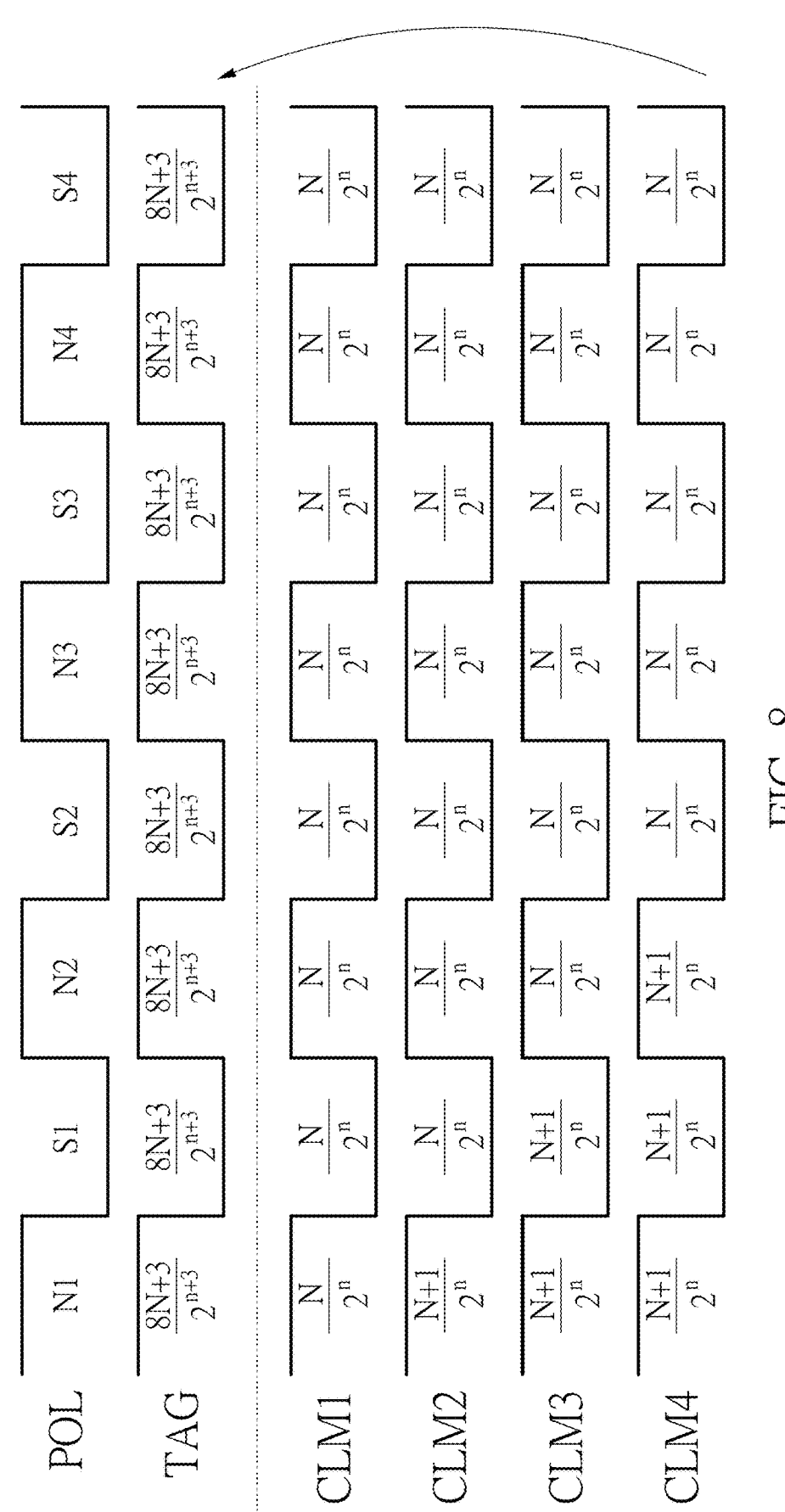
FIG. 8 is a schematic diagram of the motor detection signal, the motor control output instruction and the bit number expansion instruction of a motor controller with a data bit expansion mechanism according to a seventh embodiment of the present disclosure.

Reference is made to FIG. 8. FIG. 8 is a schematic diagram of the motor detection signal, the motor control output instruction and the bit number expansion instruction of a motor controller with a data bit expansion mechanism according to a seventh embodiment of the present disclosure.

The motor controller of the present disclosure, such as, but not limited to, the motor controller shown in FIG. 1 or FIG. 7, can generate the motor detection signal POL, the motor control output instruction TAG and the bit number expansion instruction CLM1-CLM4 as shown in FIG. 8. A more detailed description is provided as follows.

The output instruction generation circuit CMD as shown in FIG. 1 or the motor detection circuit MTD of the output instruction generation circuit CMD2 as shown in FIG. 7 detects the operating status data of the motor MT to determine whether the rotor of the motor MT has switched to a plurality of magnetic pole positions to generate a motor detection signal POL. The motor detection circuit MTD as shown in FIG. 7 outputs the motor detection signal POL to the target instruction indication circuit TGM.

As shown in FIG. 8, the working cycles and non-working cycles of the 4 waveforms of the motor detection signal POL are the 8 magnetic pole position time intervals respectively switched to the 8 magnetic pole positions N1, S1, N2, S2, N3, S3, N4, and S4.

The output instruction generation circuit CMD as shown in FIG. 1 or the target instruction indication circuit TGM of the output instruction generation circuit CMD2 as shown in FIG. 7 sets each of the 8 target waveform characteristic data used to control the operation of the motor MT within 8 magnetic pole position time intervals as "8N+3" as shown in FIG. 8, and defines the bit number "$2^{n+3}$" of each target waveform characteristic data as a target bit number to output a motor control output instruction T AG.

It is worth noting that when the bit number of any target waveform characteristic data, such as "$2^{n+3}$" shown in FIG. 8, exceeds an upper limit bit number of the motor control circuit CTR, such as "$2^{n}$", that is, when the bit number that the motor control circuit CTR can process in each bit expansion time interval is exceeded, a bit expansion operation needs to be performed on each target waveform characteristic data whose target bit number is greater than the upper limit bit number. The bit number expansion operation of the seventh embodiment of FIG. 8 is different from the bit number expansion operations of the third to fifth embodiments of FIGS. 4 to 6.

In the seventh embodiment, the bit number expansion circuit BTE generates a plurality of sub-target waveform characteristic data in each of a plurality of hierarchical control instructions according to each target waveform characteristic data whose target bit number is greater than an upper limit bit number of the motor control circuit CTR. The bit number "$2^{n}$" of each sub-target waveform characteristic data does not exceed an upper limit bit number of the motor control circuit CTR; that is, it does not exceed the bit number that the motor control circuit CTR can process in each bit expansion time interval.

For example, as shown in FIG. 8, the bit number expansion circuit BTE generates 8 sub-target waveform characteristic data "N", "N", "N", "N", "N", "N", "N", and "N" sequentially in the first-level hierarchical control instruction CLM1 according to each target waveform characteristic data "8N+3" having the target bit number "$2^{n+3}$", and the sum is "8N" which is respectively used in a plurality of bit expansion time intervals divided from the bit number expansion time interval.

Then, as shown in FIG. 8, the bit number expansion circuit BTE generates 8 sub-target waveform characteristic data "N+1", "N", "N", "N", "N", "N", "N", and "N" sequentially in the second-level hierarchical control instruction CLM1 according to the first-level hierarchical control instruction CLM1 and a part of the target waveform characteristic data "8N+3", the sum of which is "8N+1". The time lengths of the plurality of bit expansion time intervals are respectively equal to the plurality of time intervals in which the rotor of the motor MT switches to the plurality of magnetic pole positions N1, S1, N2, S2, N3, S3, N4, and S4 sequentially; that is, the plurality of magnetic pole position time intervals described in the present disclosure.

Then, as shown in FIG. 8, the bit number expansion circuit BTE generates 8 sub-target waveform characteristic data "N+1", "N+1", "N", "N", "N", "N", "N", and "N" sequentially in the third-level hierarchical control instruction CLM1 according to the second-level hierarchical control instruction CLM2 and a part of the target waveform characteristic data "8N+3", the sum of which is "8N+2", and is respectively used in the plurality of bit expansion time intervals divided by the bit expansion time interval.

Finally, as shown in FIG. 8, the bit number expansion circuit BTE generates 8 sub-target waveform characteristic data "N+1", "N+1", "N+1", "N", "N", "N", "N", and "N" sequentially in the fourth-level hierarchical control instruction CLM4 according to the third-level hierarchical control instruction CLM3 and a part of the target waveform characteristic data "8N+3", the sum of which is "8N+3", and is respectively used in the plurality of bit expansion time intervals divided by the bit expansion time interval.

In each bit expansion time interval, the motor control circuit CTR sequentially generates a plurality of normal bit numbers according to a plurality of sub-target waveform characteristic data in each of the plurality of hierarchical control instructions, and respectively output a plurality of motor control signals to the motor MT according to a plurality of normal bit expansion waveforms and a plurality of preset waveforms to control the operation of the motor MT.

The bit number of a sub-target waveform characteristic data used to control the operation of the motor MT in each bit expansion time interval is less than an upper limit bit number and does not exceed an upper limit motor control circuit CTR, that is; it does not exceed the bit number that the motor control circuit CTR can process in each bit expansion time interval. Therefore, within each bit expansion time interval, the motor control circuit CTR can control the normal operation of the motor.

The bit number expansion circuit BTE sorts the plurality of hierarchical control instructions, such as, but not limited to, the hierarchical control instructions CLM 1-CLM4 shown in FIG. 8, and outputs the plurality of hierarchical control instructions to the motor control circuit CTR in the sorted order.

In the plurality of hierarchical control instructions, except for the hierarchical control instruction in the first order, such as the hierarchical control instruction CLM 1 shown in FIG. 8, each other hierarchical control instruction includes a plurality of sub-target waveform characteristic data and other part of the target waveform characteristic data in the previous order. The sum of the plurality of sub-target waveform characteristic data "N+1", "N+1", "N+1", "N", "N", "N", "N" and "N" is the same as a target waveform characteristic data "8N+3".

Therefore, the motor controller of the seventh embodiment of the present disclosure can control the state of the motor MT to gradually change to the target state. For example, the rotational speed of the motor MT gradually increases until it reaches the target rotational speed.

Figure 9:
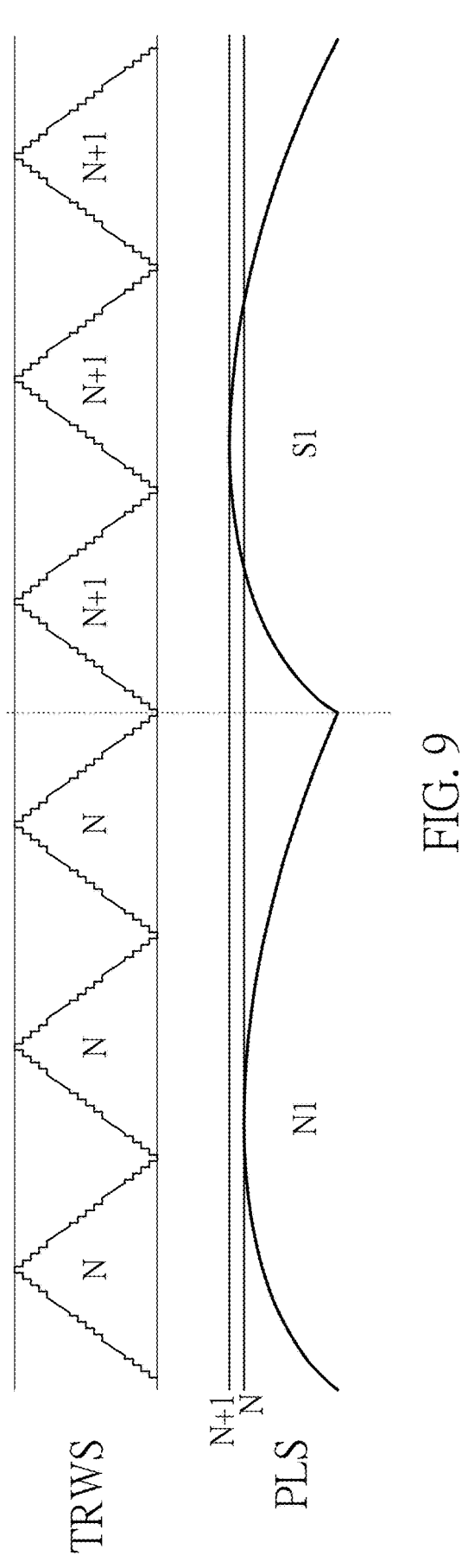
FIG. 9 is a schematic diagram of the bit number expansion waveform signal and the motor detection signal of a motor controller with a data bit expansion mechanism according to an eighth embodiment of the present disclosure.

Reference is made to FIG. 9. FIG. 9 is a schematic diagram of the bit number expansion waveform signal and the motor detection signal of a motor controller with a data bit expansion mechanism according to an eighth embodiment of the present disclosure.

The motor controller of the present disclosure, such as, but not limited to the motor controller shown in FIG. 1, FIG. 3 or FIG. 7, can generate the bit number expansion waveform signal TRWS and the motor detection signal P LS as shown in FIG. 9.

The output instruction generation circuit CMD as shown in FIG. 1, the motor detection circuit MTD of the output instruction generation circuit CMD1 as shown in FIG. 3, or the motor detection circuit MTD of the output instruction generation circuit CMD2 as shown in FIG. 7 detects the operating status data of the motor MT to determine that the rotor of the motor MT is switched to a plurality of magnetic pole positions, such as, but not limited to the magnetic pole positions N1 and S1 as shown in FIG. 9, to generate the motor detection signal PLS. The motor detection circuit MTD as shown in FIG. 3 or FIG. 7 outputs the motor detection signal PLS to the target instruction indication circuit TGM.

The magnetic pole position to which the rotor of the motor MT switches in each of the plurality of bit number expansion time intervals, such as, but not limited to the magnetic pole position N1 as shown in FIG. 9 may be different from the magnetic pole position to which the rotor of the motor MT switches in the previous and next of the plurality of bit number expansion time intervals.

The rising band, the falling band, or both of each of the plurality of bit expansion waveforms generated by the motor control circuit CTR of FIG. 1, FIG. 3 or FIG. 7 in the bit expansion waveform signal TRWS as shown in FIG. 9 includes a plurality of stepped segments.

If necessary, the motor control circuit CTR can pre-store a preset waveform according to each sub-target waveform characteristic data such as, but not limited to "N", "N", "N", "N+1", "N+1", and "N+1" as shown in FIG. 9, to modulate the time length of one or more of the plurality of stepped segments of a preset waveform to form a bit number expansion waveform, respectively.

It is worth noting that when the rotor of the motor MT switches to the same magnetic pole position in the plurality of magnetic pole positions, such as, but not limited to the magnetic pole position N1 as shown in FIG. 9, the plurality of bit number expansion waveforms generated by the motor control circuit CTR are identical to each other. For example, the number of stepped segments cut into the rising band, the falling band, or is the same for both, the height of each stepped segment (i.e., voltage) is the same, and the width of each stepped segment (i.e., time) is the same.

It is not until the rotor of the motor MT switches to different magnetic pole positions that the motor control circuit CTR changes the bit number expansion waveform. For example, as shown in FIG. 9, when the rotor of the motor MT switches to the magnetic pole position N1, three bit number expansion waveforms "N", "N", and "N" are generated according to the sub-target waveform characteristic data. Then, when the rotor of the motor MT switches from the magnetic pole position N1 to the magnetic pole position S1, the other three bit number expansion waveforms "N+1", "N+1", "N+1" are generated according to the sub-target waveform characteristic data.

Therefore, the motor controller of the present disclosure can control the motor MT to operate stably.

To sum up, the present disclosure provides a motor controller with a data bit expansion mechanism. When the bit number of the motor control output instruction used to control the state of the motor to change to the target state exceeds the bit number that the motor control circuit can process, the motor controller of the present disclosure performs a bit number expansion operation on the motor control output instruction to reduce the resolution of the motor control output instruction by breaking it up. As a result, the present disclosure uses a motor controller with lower resolution, computing power, etc., but can still achieve high-resolution motor control and smoothly control the state of the motor to gradually change to the target state. For example, the rotational speed of the motor gradually increases until it reaches the target rotational speed, thereby saving circuit costs. Furthermore, the motor controller of the present disclosure can maintain stable operation of the motor while providing high resolution.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A motor controller with a data bit expansion mechanism, including:

an output instruction generation circuit configured to set a plurality of target waveform characteristic data respectively for a plurality of magnetic pole position time intervals to output a motor control output instruction, wherein the target waveform characteristic data of each magnetic pole position time interval has a target bit number;

a bit number expansion circuit connected to the output instruction generation circuit and configured to generate a plurality of sub-target waveform characteristic data in a bit number expansion instruction according to each target waveform characteristic data whose target bit number is greater than an upper limit bit number, and a plurality of the sub-target waveform characteristic data of each target waveform characteristic data, wherein the bit number of each sub-target waveform characteristic data is less than the upper limit bit number; and a motor control circuit connected to the bit number expansion circuit and a motor and configured to generate a plurality of waveforms respectively having the plurality of sub-target waveform characteristic data as a plurality of bit number expansion waveforms according to the bit number expansion instruction received from the bit number expansion circuit, and control the motor in a plurality of bit expansion time intervals divided from a bit number expansion time interval according to the plurality of bit number expansion waveforms;

wherein the motor control circuit outputs a plurality of motor control signals to the motor according to the plurality of the bit number expansion waveforms and a plurality of preset waveforms.

2. The motor controller according to claim 1, wherein the plurality of bit number expansion waveforms include a plurality of triangle wave waveforms, a plurality of sawtooth wave waveforms, or any combination thereof.

3. The motor controller according to claim 1, wherein the plurality of preset waveforms include a plurality of sine wave waveforms, a plurality of third harmonic waveforms, or any combination thereof.

4. The motor controller according to claim 1, wherein the motor control signal includes a plurality of pulse waves.

5. The motor controller according to claim 1, wherein the output instruction generation circuit sets target waveform characteristic data for each magnetic pole position time interval according to a motor control input instruction received from an external input instruction issuing circuit connected to a phase.

6. The motor controller according to claim 5, wherein the output instruction generation circuit is connected to the motor and configured to detect an operating status data of the motor to determine which one of a plurality of magnetic pole positions a rotor of the motor switches to within each magnetic pole position time interval to generate a motor detection signal, and output the motor control output instruction according to the motor detection signal and the motor control input instruction.

7. The motor controller according to claim 6, wherein the operating status data includes a rotational speed of the motor.

8. The motor controller according to claim 6, wherein the plurality of magnetic pole positions of the rotor of the motor are two magnetic pole positions, four magnetic pole positions, or eight magnetic pole positions.

9. The motor controller according to claim 6, wherein the magnetic pole position that the rotor of the motor switches to one of the plurality of the bit number expansion time intervals is different from the magnetic pole position that the rotor of the motor switches to a next or previous one of the plurality of bit number expansion time intervals.

10. The motor controller according to claim 1, wherein a rising band, a falling band, or both of the rising band and the falling band of each bit number expansion waveform generated by the motor control circuit include a plurality of stepped segments.

11. The motor controller according to claim 10, wherein the motor control circuit modulates a time length of one or more of the plurality of stepped segments of a preset waveform according to each sub-target waveform characteristic data to form the bit number expansion waveform.

12. The motor controller according to claim 1, wherein, when the motor switches to a same one of the plurality of magnetic pole positions, the plurality of bit number expansion waveforms generated by the motor control circuit are identical to each other.

13. The motor controller according to claim 1, wherein, when the motor switches from one of the plurality of magnetic pole positions to another, the motor control circuit adjusts the plurality of bit number expansion waveforms for controlling the motor.

14. The motor controller according to claim 1, wherein the output instruction generation circuit includes:

an input instruction detection circuit connected to an external input instruction issuing circuit and configured to detect a motor control input instruction output by the external input instruction issuing circuit to output an input control detection signal;

a motor detection circuit connected to the motor and configured to detect operating status data of the motor to output a motor detection signal; and a target instruction indication circuit connected to the input instruction detection circuit and the motor detection circuit, and configured to output the motor control output instruction according to the input control detection signal and the motor detection signal.

15. The motor controller according to claim 14, wherein the target instruction indication circuit is an open-loop circuit.

16. The motor controller according to claim 1, wherein the output instruction generation circuit divides each target waveform characteristic data whose target bit number is greater than the upper limit bit number into the plurality of the sub-target waveform characteristic data respectively used to a same bit number expansion time interval divided into a plurality of consecutive bit number expansion time intervals, wherein a sum of the plurality of sub-target waveform characteristic data respectively used in the plurality of consecutive bit number expansion time intervals is equal to the target waveform characteristic data.

17. The motor controller according to claim 1, wherein the output instruction generation circuit includes:

a magnetic pole switching loop calculation circuit connected to an external input instruction issuing circuit and configured to switch the rotor of the motor to a time interval in which the rotor of the motor sequentially switches to all of the plurality of magnetic pole positions to be defined as a magnetic pole switching cycle, a time interval in which the rotor of the motor switches to each magnetic pole position is defined as the magnetic pole position time interval, and calculating a number of the plurality of magnetic pole switching loops according to the motor control input instruction received from the external input instruction issuing circuit to output the magnetic pole switching loop calculation signal;

a motor detection circuit connected to the motor and configured to detect an operating status data of the motor to output the motor detection signal; and a target instruction indication circuit connected to the magnetic pole switching loop calculation circuit and the motor detection circuit and configured to set the target waveform characteristic data in each magnetic pole position time interval according to the magnetic pole switching loop calculation signal and the motor detection signal to output the motor control output instruction.

18. The motor controller according to claim 17, wherein the target instruction indication circuit is a closed loop circuit.

19. The motor controller according to claim 1, wherein the bit number expansion circuit generates the plurality of sub-target waveform characteristic data within each of a plurality of hierarchical control instructions according to each target waveform characteristic data whose target bit number is greater than the upper limit bit number;

wherein the bit number expansion circuit sorts the plurality of the hierarchical control instructions and outputs the plurality of the hierarchical control instructions in sequence, and except for the hierarchical control instructions in a first order, a sum of each of the other hierarchical control instructions including the plurality of the sub-target waveform characteristic data and other part of the target waveform characteristic data of the hierarchical control instruction in a previous order, and the plurality of sub-target waveform characteristic data in the hierarchical control instructions at the end of the order is the same as the target waveform characteristic data;

wherein the bit number expansion instruction includes the plurality of the hierarchical control instructions.

* * * * *